United States Patent
Suzuki et al.

(10) Patent No.: US 10,973,159 B2
(45) Date of Patent: *Apr. 6, 2021

(54) COMPONENT MOUNTING MACHINE FOR PREVENTING RELEASE FAIL OF A COMPONENT

(71) Applicant: FUJI CORPORATION, Chiryu (JP)

(72) Inventors: Daisuke Suzuki, Anjo (JP); Seiji Shibata, Okazaki (JP); Satoshi Iwashima, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/828,775

(22) Filed: Mar. 24, 2020

(65) Prior Publication Data

US 2020/0229332 A1    Jul. 16, 2020

Related U.S. Application Data

(63) Continuation of application No. 15/574,891, filed as application No. PCT/JP2015/066067 on Jun. 3, 2015, now Pat. No. 10,631,451.

(51) Int. Cl.
*H05K 13/04*    (2006.01)
*H05K 13/08*    (2006.01)
(Continued)

(52) U.S. Cl.
CPC ......... *H05K 13/0413* (2013.01); *G05B 19/44* (2013.01); *H01L 21/6838* (2013.01);
(Continued)

(58) Field of Classification Search
CPC ............. H05K 13/0413; H05K 13/082; H05K 13/0409; H05K 13/0452; H05K 13/022; H05K 13/08; H01L 21/6838
See application file for complete search history.

(56) References Cited

U.S. PATENT DOCUMENTS

| | | |
|---|---|---|
| 6,085,893 A | 7/2000 | Asai |
| 6,256,876 B1 | 7/2001 | Ohe |
| 2005/0102826 A1 | 5/2005 | Asai |

FOREIGN PATENT DOCUMENTS

| | | |
|---|---|---|
| JP | 8-250897 A | 9/1996 |
| JP | 2003-142888 A | 5/2003 |

(Continued)

OTHER PUBLICATIONS

International Search Report issued in PCT/JP2015/066067 dated Sep. 1, 2015.

*Primary Examiner* — Robert E Fennema
*Assistant Examiner* — Jonathan Michael Skrzycki
(74) *Attorney, Agent, or Firm* — Oblon, McClelland, Maier & Neustadt, L.L.P.

(57) ABSTRACT

A component mounting machine which deals with a component remaining on a nozzle of a mounting head includes a board conveyance device conveying a board to a predetermined position, a component supply device accommodating multiple components therein, a component mounting device on which a mounting head which picks up and holds a component by vacuum pumping of a suction nozzle is installed and which mounts a component which is taken out from the component supply device onto a board which is conveyed by the board conveyance device, and a control device controlling each of the devices. The component mounting device performs lowering of the component, releasing the component with respect to the suction nozzle of the mounting head, a first lifting of the component to a middle height, a component pickup performed at the height of the first lifting, and a second lifting after the component pickup.

1 Claim, 5 Drawing Sheets

(51) Int. Cl.
*G05B 19/44* (2006.01)
*H01L 21/683* (2006.01)

(52) U.S. Cl.
CPC ....... *H05K 13/0409* (2018.08); *H05K 13/082* (2018.08); *G05B 2219/25312* (2013.01)

(56) References Cited

FOREIGN PATENT DOCUMENTS

| | | |
|---|---|---|
| JP | 2011-54858 A | 3/2011 |
| JP | 2011-159964 A | 8/2011 |

COMPONENT MOUNTING MACHINE FOR PREVENTING RELEASE FAIL OF A COMPONENT

CROSS-REFERENCE TO RELATED APPLICATIONS

This application is a continuation of U.S. application Ser. No. 15/574,891 filed Nov. 17, 2017, the entire contents of which is incorporated herein by reference. U.S. application Ser. No. 15/574,891 is a 371 of International Application No. PCT/JP2015/066067 filed Jun. 3, 2015.

TECHNICAL FIELD

The present disclosure relates to a component mounting machine that deals with a release failure of a component which has been picked up and held.

BACKGROUND ART

For example, a mounting head that is provided with a suction nozzle for mounting an electronic component onto a circuit board is installed in an electronic component mounting machine, and an electronic component to be picked up and held by the suction nozzle is taken out from a component supply section and mounted onto the circuit board. The picking up and holding of the electronic component by the suction nozzle is performed by applying negative pressure inside the nozzle via vacuum pumping after a suction port has contacted the electronic component. The electronic component which is taken out from a component supply device by such pickup and holding is moved to the circuit board by the movement of the mounting head, and after the electronic component has been placed at a predetermined position on the circuit board, the electronic component is released by the vacuum pumping at the suction nozzle being canceled.

CITATION LIST

Patent Literature

PTL 1: JP-A-8-250897
PTL 2: JP-A-2011-159964

SUMMARY

In the component mounting machine described above, the electronic component is released by the canceling of the vacuum pumping; however, the electronic component may not separate from the suction port and may remain held without being mounted onto the circuit board. In such a case, a so-called remained-on-nozzle phenomenon occurs in which the electronic component is lifted up while adhering to the suction nozzle as the suction nozzle is lifted, and the electronic component may subsequently fall in the middle of the movement of the mounting head. Thus, there is a problem of an electronic component falling onto the circuit board and causing detrimental influence such as a reduction in quality or a production defect for the produced board.

In PTL 1 and 2, in addition to the mounting work onto the circuit board, a component measurement instrument that performs component measurement of the electronic component is disclosed. With the component measurement instrument, the electronic component is carried by the mounting head and, in the same manner, the electronic component released by canceling the vacuum pumping is set at a measurement location. However, with the component measurement instrument, since solder, flux, or the like is not applied as with component mounting onto a circuit board, the electronic component remains on the suction nozzle more easily. In this case too, the electronic component may fall in the middle of movement due to the electronic component remaining on the suction nozzle, again causing detrimental influence such as a reduction in quality or a production defect for the produced board.

Therefore, in order to solve the problem, an object of the present disclosure is to provide a component mounting machine that deals the problem of a component remaining on the mounting head.

A component mounting machine according to an aspect of the present disclosure includes a board conveyance device configured to convey a board to a predetermined position, a component supply device configured to accommodate multiple components therein, a component mounting device, on which a mounting head capable of picking up and holding a component by vacuum pumping of a suction nozzle is installed, configured to mount a component taken out from the component supply device onto a board conveyed by the board conveyance device, and a control device configured to control each of the devices, in which in the component mounting device, through drive control of the control device, a lowering step of lowering the component, a component release step of releasing the component are performed with respect to the suction nozzle of the mounting head, and subsequently, a first lifting step of lifting the component to a middle height, a component pickup step performed at the height of the first lifting step, and a second lifting step after the component pickup step are performed.

According to the present disclosure, through the drive control of the control device with respect to the component mounting device, after the component which is picked up and held by the suction nozzle is lowered and released, since the lifting of the suction nozzle is divided into the first lifting step and the second lifting step and the component pickup step of picking up and holding the component is performed in the middle, even if, hypothetically, the component remains on the suction nozzle, action of to pick up and hold the component is performed again. Accordingly, it is possible to prevent detrimental influence which occurs when the electronic component falls in the middle due to the electronic component having remained on the nozzle.

DESCRIPTION OF EMBODIMENTS

Figure 1:
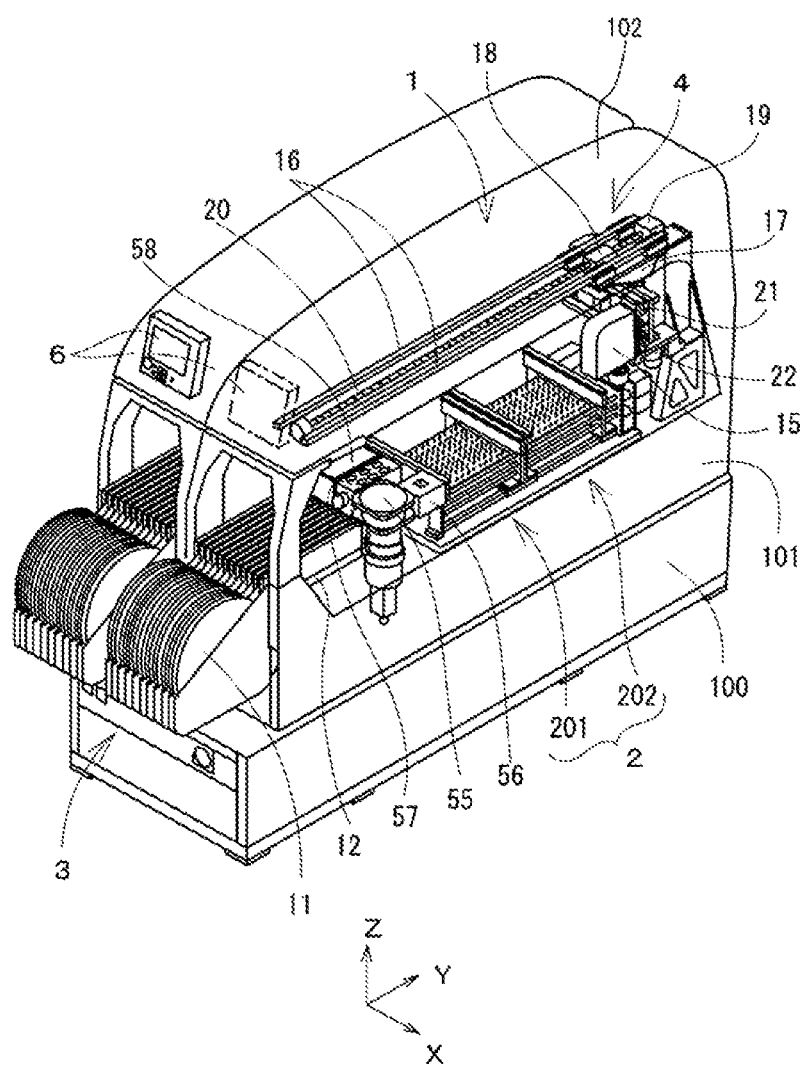
FIG. 1 is an external appearance perspective view with partial transparency illustrating an embodiment of a component mounting machine.

Next, a description will be given of an embodiment of the component mounting machine according to the present disclosure with reference to the drawings. In the present embodiment, a description will be given using an electronic component mounting machine that mounts an electronic component onto a circuit board as an example. FIG. 1 is an external appearance perspective view with partial transparency illustrating the electronic component mounting machine. The view illustrates multiple electronic component mounting machines 1 lined up in a width direction, circuit boards being conveyed in order in the inner portion of each of the electronic component mounting machines 1, and predetermined electronic components being mounted in each of the electronic component mounting machines 1. FIG. 1 illustrates two electronic component mounting machines 1 installed on base 100; however, the number of electronic component mounting machines 1 can be changed freely according to the manufacturing content.

Electronic component mounting machine 1 includes a large openings in the sides in the width direction and transferring of the circuit boards is performed between adjacent electronic component mounting machines 1 through the openings. Regarding the directions given in the following description, as illustrated in FIG. 1, the width direction of electronic component mounting machine 1 which is the direction in which the circuit boards are conveyed is an X-axis direction, a longitudinal direction of electronic component mounting machine 1 which is perpendicular to the X-axis direction is a Y-axis direction, and a height direction of electronic component mounting machine 1 is a Z-axis direction.

Board conveyance device 2 which conveys circuit boards is present at the center portion of electronic component mounting machine 1 in the longitudinal direction and component supply device 3 which supplies electronic components is configured at the front side as shown in the drawing (the front side of electronic component mounting machine 1). Component mounting device 4 provided with a driving mechanism is also provided. Component mounting device 4 includes mounting head 15 which performs picking up, holding, and releasing of electronic components, and moves mounting head 15. In electronic component mounting machine 1, board conveyance device 2, component supply device 3, component mounting device 4, and the like are assembled onto mounting machine main body 101, and main body cover 102 which covers board conveyance device 2, component supply device 3, component mounting device 4, and the like is formed integrally with mounting machine main body 101.

In board conveyance device 2, two conveyance sections 201 and 202 of the same configuration are provided lined up and the conveyance of the circuit boards and the mounting work of the electronic components onto the circuit boards are performed at two locations. Each of the conveyance sections 201 and 202 has a pair of guides installed in parallel to match the width dimension of the circuit boards and is provided with a conveyor for moving the circuit board in the X-axis direction on the guides. In component supply device 3, device table 12 is installed on the front opening section of mounting machine main body 101, and multiple tape feeders 11 are installed on device table 12. In tape feeder 11, a tape which accommodates electronic components is unwound from a reel and the electronic components are supplied to a component supply position inside the machine one at a time.

The electronic components which are supplied by component supply device 3 are picked up by component mounting device 4 and mounted onto the circuit boards. Component mounting device 4 is configured such that mounting head 15 which handles the electronic components is capable of moving over an XY-plane. Two Y-axis rails 16 are fixed in parallel to a ceiling portion and Y-axis slider 17 is attached to Y-axis rails 16 to slide freely. Nut 18 is fixed to Y-axis slider 17, screw shaft 20 which is connected to Y-axis servomotor 19 passes through and screws into nut 18, thus configuring a ball screw mechanism.

Figure 2:
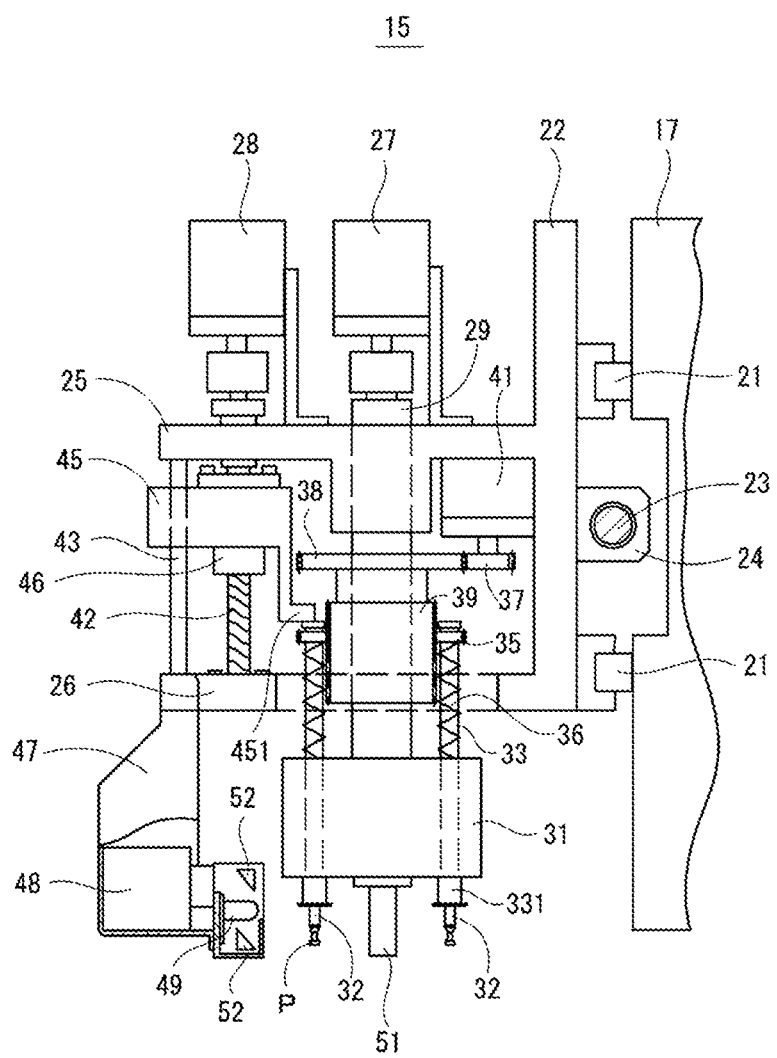
FIG. 2 is a side view illustrating an internal structure of a mounting head.

FIG. 2 is a side view illustrating the internal structure of mounting head 15. A vertical pair of X-axis rails 21 is formed on Y-axis slider 17 and X-axis slider 22 is attached to the X-axis rails 21 to slide freely. Mounting head 15 is installed on X-axis slider 22. An X-axis servomotor is fixed to Y-axis slider 17, screw shaft 23 which is connected to the output shaft of the X-axis servomotor passes through and screws into nut 24 which is fixed to X-axis slider 22, thus configuring a ball screw mechanism.

Upper and lower frames 25 and 26 protrude horizontally from X-axis slider 22 and turning motor 27 and lifting and lowering motor 28 are attached to upper frame 25 with the output shafts thereof oriented vertically downward. Rotation shaft 29 which is disposed in the vertical direction is connected to the output shaft of turning motor 27 and nozzle holder 31 is fixed to the lower end portion of the output shaft which passes through frames 25 and 26. Multiple suction nozzles 32 are attached to nozzle holders 31 on a circumference centered on the axial center of rotation shaft 29.

Each of the suction nozzles 32 is formed integrally with spindle 33 which passes through nozzle holder 31 in the up-down direction and is capable of sliding. Spring 36 is provided between nozzle gear 35 which is fixed to the upper end portion of spindle 33 and nozzle holder 31, and spindle 33 is always biased upward. However, since flange section 331 of spindle 33 comes into contact with the lower face of nozzle holder 31 and movement upward is restricted, suction nozzle 32 is normally positioned at the illustrated upper limit positions. Nozzle gear 35 is configured such that the rotation of servomotor 41 is transmitted via gears 37, 38, and 39 such that all of the suction nozzles 32 rotate at once on their own axes.

Screw shaft 42 is connected to the output shaft of lifting and lowering motor 28. Screw shaft 42 is supported by bearings which are provided on upper and lower frames 25 and 26 to rotate freely. Guide rod 43 which is disposed vertically is fixed to frames 25 and 26 and nozzle lever 45 is attached to guide rod 43 to slide freely. Nut 46 is fixed to nozzle lever 45, screw shaft 42 passes through and screws into nut 46, thus configuring a ball screw mechanism. Hand section 451 which presses spindle 33 from above is formed on nozzle lever 45, and due to nozzle lever 45 moving up and down through the driving of lifting and lowering motor 28, suction nozzle 32 is caused to move up and down via hand section 451.

In mounting head 15, bracket 47 is fixed to frame 26 and nozzle camera 48 which images an electronic component P which is held by suction nozzle 32 is provided. Therefore, in electronic component mounting machine 1 of the present embodiment, it is possible to determine whether the electronic component P is present or absent on the distal end of suction nozzle 32 due to the holding or the releasing by mounting head 15. Therefore, in mounting head 15, a detection device is configured in which light which is emitted from LED 49 is reflected by reflective body 51 to the rear of the electronic component P, further passes through reflecting prism 52 inside the bracket 47, and enters nozzle camera 48.

Figure 3:
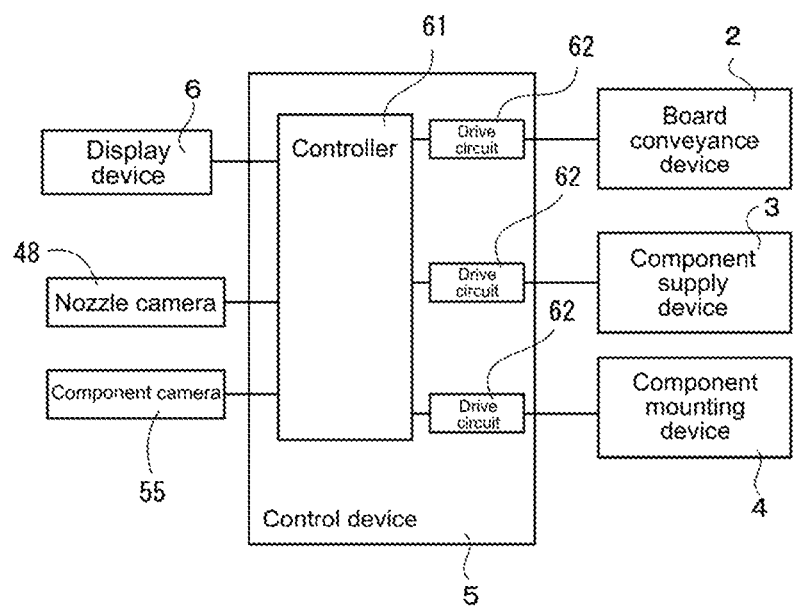
FIG. 3 is a block diagram illustrating an outline of a control device of the component mounting machine.

Also, a control device for controlling the driving of the each of devices is provided in the electronic component mounting machine 1. FIG. 3 is a block diagram illustrating an outline of the control device. Control device 5 includes controller 61 and is provided with drive circuits 62 which are for driving drive means such as servo motors which configure board conveyance device 2, component supply device 3, and component mounting device 4. The main component of controller 61 is a computer which is provided with a CPU and storage devices such as a ROM, a RAM, and a non-volatile memory. Controller 61 is connected to the drive means of each of the devices via drive circuits 62. Controller 61 is also connected to display device 6, nozzle camera 48, component camera 55, and the like.

In controller 61, various data processing is performed by the CPU and a system program is stored in the ROM which is a storage device. By reading out the system program using the CPU, the control management is performed for all of the driving sections of electronic component mounting machine 1. Calculation data and display data are temporarily stored in the RAM and component mounting programs, various parameters, and the like for creating the electronic circuit boards which are the production target are stored in the non-volatile memory which is similarly a storage device. In particular, in the present embodiment, a work program which performs the pickup operation again after the releasing of the electronic component by mounting head 15 is stored in the non-volatile memory.

Next, a description will be given of operations of electronic component mounting machine 1 of the present embodiment. The circuit board which is carried into the machine inner portion of electronic component mounting machine 1 is conveyed to the working position and is positioned by board conveyance device 2. Mounting head 15 moves to a predetermined position through the driving of component mounting device 4, and through the lifting and lowering of suction nozzle 32, the electronic component is taken out from component supply device 3 and mounting onto the circuit board is performed. At this time, in mounting head 15, turning motor 27 is driven and the indexing of suction nozzles 32 corresponding to the electronic components is performed. The electronic components are imaged by nozzle camera 48 and recognition of the presence, the type, and the like of the electronic components from the captured image data is performed.

In mounting head 15 which is moved to a predetermined position through the driving of component mounting device 4, the lifting and lowering of suction nozzle 32 is performed when picking up, holding, and releasing the electronic component. The rotation of lifting and lowering motor 28 is converted into linear motion by the ball screw mechanism and the lifting and lowering of suction nozzle 32 is performed by nozzle lever 45 causing spindle 33 to move up and down. In suction nozzle 32, the electronic component is picked up and held to the suction port of the distal end by vacuum pumping and the electronic component is released from the suction port through canceling of the vacuum pumping.

However, since the releasing of the electronic component is carried out by merely canceling the vacuum pumping and the electronic component is not actively removed from the suction nozzle 32, the so-called remained-on-nozzle phenomenon in which the electronic component remains held by the suction nozzle 32 may occur. This means a problem such as a production defect or the like may occur due to the electronic component falling while being moved. In particular, in the component mounting machine of the present embodiment, component measurement instrument 56 is installed between board conveyance device 2 and component supply device 3 as illustrated in FIG. 1. In component measurement instrument 56, since the electronic component is simply placed and solder, flux, or the like is not applied as in the case of the circuit board, the electronic component remains on the nozzle more easily. Therefore, in the present embodiment, a work program to counter the remained-on-nozzle problem during the component measurement process which is performed by component measurement instrument 56 is stored in controller 61.

Figure 4:
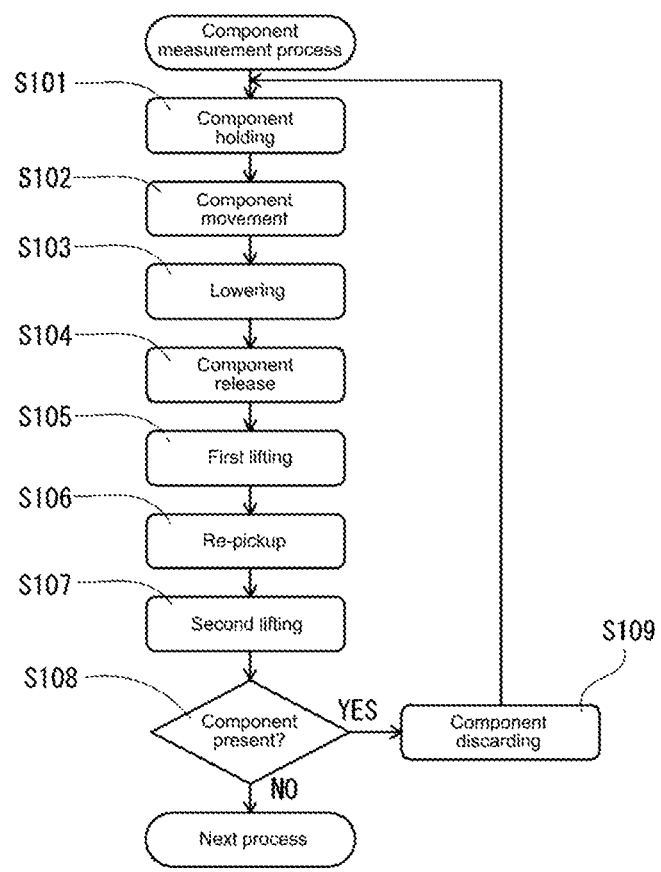
FIG. 4 is, among drive control by a work program, a control flow diagram of the mounting head performed with respect to a component measurement instrument.
Figure 5:
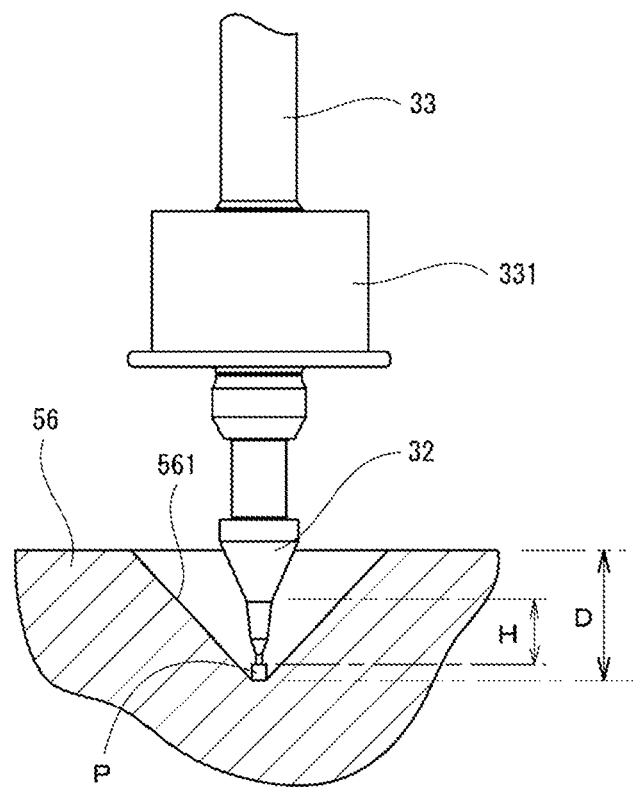
FIG. 5 is a side view illustrating a state in which an electronic component is disposed in the component measurement instrument.

FIG. 4 is, among drive control by a work program, a control flow diagram of the mounting head performed with respect to a component measurement instrument. FIG. 5 is a side view illustrating a state in which the electronic component is disposed in component measurement instrument 56. Component measurement instrument 56 measures the values of the inductance, the capacitance, and the resistance which are the electrical properties of the electronic component, and accordingly, it is possible to determine whether the electronic component which is taken out from component supply device 3 by suction nozzle 32 is the planned electronic component. Therefore, in a case in which the reel in each of the tape feeders 11 is newly changed during startup or during the operation of electronic component mounting machine 1, the electronic component which is first taken out from the tape is first carried to component measurement instrument 56 in order to determine whether the electronic component is the planned electronic component.

In the component measurement process which is performed by component measurement instrument 56, mounting head 15 moves to the component supply position of the corresponding tape feeder 11 through the driving of component mounting device 4, suction nozzle 32 is lowered to pick up and hold the electronic component, and then suction nozzle 32 is lifted (S101). Since suction nozzle 32 is in a vacuum pumped state during the transferring of the electronic component, the electronic component is stable in a state of being held by suction nozzle 32. After mounting head 15 moves to component measurement instrument 56 and is positioned (S102), suction nozzle 32 is lowered via spindle 33, and as illustrated in FIG. 5, the electronic component P is disposed inside component measurement section 561 of component measurement instrument 56 (S103).

Component measurement section 561 of component measurement instrument 56 is formed in a trapezoid shape and the electronic component P is disposed at the lowest part of the bottom section. After the disposition of the electronic component P, the vacuum pumping of suction nozzle 32 is canceled (S104) and a first lifting of suction nozzle 32 is performed (S105). In the first lifting, the distal end of suction nozzle 32 is at a height within component measurement section 561. This is so that, in a case in which the electronic component remains held by suction nozzle 32, the separated electronic component P does not fall onto the adjacent parts camera 55 or the like. In the present embodiment, a depth D of component measurement section 561 is 4.5 mm; however, a height H of the first lifting is a position at which suction nozzle 32 is lifted by 2.5 mm from the state illustrated in FIG. 5.

In the first lifting, drive control is performed at a lower speed than in the following second lifting. This is so that, in a case in which the electronic component P remains held by suction nozzle 32, the electronic component P does not fall in the middle of the lifting. This is because, in a case in which the measurement is performed in a state in which the electronic component P has fallen and the orientation of the electronic component is not correct, it becomes impossible to distinguish as to whether the value is due to a defect of the electronic component itself or a measurement defect caused by the incorrect orientation. Re-pickup of suction nozzle 32 which stops temporarily after the first lifting is performed using vacuum pumping (S106). At this time, if the electronic component P is adhering to the distal end of suction nozzle 32, the electronic component P is picked up and held again and the state is stabilized.

Meanwhile, in a case in which the electronic component P is not adhering to the distal end of suction nozzle 32, only simple suction of air is performed; however, since it is not possible to determine the presence of the electronic component P at this stage, the vacuum pumping is continued. Therefore, the second lifting of suction nozzle 32 is performed in a state in which the re-pickup is being performed (S107). The second lifting is lifting at normal speed since the electronic component P is being held by vacuum pumping. After the second lifting, since the distal end of suction nozzle 32 is at the position illustrated in FIG. 2, the presence of the electronic component P is determined from the captured image data which is acquired by nozzle camera 48 (S108). Therefore, in a case in which the electronic component P is being held by suction nozzle 32 (S108: YES), discarding of the electronic component P is performed (S109).

As illustrated in FIG. 1, in electronic component mounting machine 1, in addition to component measurement instrument 56, component camera 55, nozzle station 57, and collection box 58 are installed between board conveyance device 2 and component supply device 3. Therefore, in a discarding step, mounting head 15 moves above collection box 64, the vacuum pumping is canceled, and thus, the electronic component which is separated from suction nozzle 32 falls into collection box 64. The electronic component P which is released midair falls under its own weight.

In this manner, in a case in which the electronic component P is discarded and the target measurement is not achieved, the steps S101 to S107 are repeated. In other words, after the discarding of the electronic component is completed, the electronic component is taken out from the relevant tape feeder 11 again and is carried to component measurement instrument 56. Meanwhile, if the electronic component is not held by suction nozzle 32 according to the determination (S108: NO), the next process is performed. For example, as a result of the measurement, in a case in which the electronic component is the planned electronic component, the process transitions to the component mounting process for mounting the electronic component onto the circuit board, and in a case in which the electronic component is not the planned electronic component, since exchanging the tape feeder becomes necessary, the process transitions to a standby process.

Note that, in electronic component mounting machine 1 of the present embodiment, nozzle camera 48 for determining the presence of the electronic component is installed on mounting head 15. However, there are also electronic component mounting machines not installed with nozzle camera 48. Even in such an electronic component mounting machine, an electronic component which remains on the nozzle must be reliably discarded. Therefore, in an electronic component mounting machine in which nozzle camera 48 is not installed, regardless of whether or not the electronic component remains on the nozzle, in all cases, the discarding step of the electronic component is performed. In other words, the step S108 of the control flow illustrated in FIG. 4 is omitted, and after the steps S101 to S107 are performed, a component discarding step of S109 is performed.

Specifically, mounting head 15 which completes the second lifting of suction nozzle 32 moves above collection box 64 in a state in which the vacuum pumping is being performed regardless of the presence or absence of the electronic component and cancels the vacuum pumping. In a case of a remained-on-nozzle state, the electronic component is separated from suction nozzle 32 and falls into the collection box 58, and in a case where an electronic component is not being held, nothing occurs. In a case in which the electronic component remains on the nozzle, since a measurement error determination is assumed for the electronic component, the electronic component which is taken out from the relevant tape feeder 11 again is carried to component measurement instrument 56 and the steps S101 to S107 are repeated. Meanwhile, in a case in which the measurement of the electronic component is performed, the next process is performed based on a measurement complete signal.

In the work program which is described earlier, a description is given of a case which deals with an electronic component remaining on the nozzle after a component measurement process; however, the control of the component measurement process illustrated in FIG. 4 may be performed as control of the component mounting process of an electronic component onto a circuit board. The electronic component remains on the nozzle easily at component measurement instrument 56 as described earlier, but the problem does not occur easily during the mounting process of the electronic component since solder or the like is applied to the circuit board. However, the likelihood is not zero, and in a case in which the electronic component remains on the nozzle, a detrimental influence to the produced board or the like may occur due to a fallen electronic component. Accordingly, even in a component mounting process which is performed on the circuit board, it is valid to perform a similar control process to that of the component measurement process illustrated in FIG. 4.

In the component mounting process, the electronic component is picked up and held by suction nozzle 32 from the corresponding tape feeder 11 (S101), and after mounting head 15 is moved to the mounting position on the circuit board (S102), the mounting of the electronic component onto the circuit board is performed by the lowering of suction nozzle 32 and the releasing of the electronic component (S103 and S104). Subsequently, the first lifting of suction nozzle 32 is performed (S105) and re-pickup by vacuum pumping is performed at suction nozzle 32 which stops temporarily (S106).

The second lifting of suction nozzle 32 is performed (S107) and the presence of the electronic component is determined from the captured image data which is acquired by nozzle camera 48 (S108). In a case in which the electronic component is being held by suction nozzle 32, a discarding process is performed (S108: YES and S109) and the steps S101 to S107 are repeated for the electronic components of the relevant tape feeders 11 again. Meanwhile, if the electronic component is not being held by suction nozzle 32 according to the determination, the component mounting process is performed for the next electronic component (S108: NO).

In electronic component mounting machine 1, in a case in which nozzle camera 48 is not installed on mounting head 15, the step S108 of the flow illustrated in FIG. 4 is omitted, and after the steps S101 to S107 are performed, the discarding of the electronic component is performed in S109. However, in the component mounting process, the presence of the electronic component is determined by the electronic component passing over component camera 55. As a result, if the electronic component is not being held by suction nozzle 32, the component mounting of a different location is performed in the next process, and if the electronic component is being held by the suction nozzle 32, the mounting of the electronic component to the same location is performed again in the next process.

Therefore, according to electronic component mounting machine 1 of the present embodiment, even if the remained-on-nozzle phenomenon of the electronic component occurs in the component measurement process or the component mounting process, since after the first lifting (S105), the re-pickup of the electronic component (S106) is performed, it is possible to prevent detrimental influence such as a lowering of quality or a production defect of the produced board and imaging problems by component camera 55 caused by the electronic component falling. Since it is possible to achieve such an effect with an unchanged electronic component mounting machine of the related art by merely changing to a program with the steps illustrated in FIG. 4 added, it is possible to realize the effect at low cost. In electronic component mounting machine 1, since nozzle camera 48 is installed on mounting head 15, since it is possible to determine the remained-on-nozzle of the electronic component at a point in time of the second lifting, it is possible to omit the subsequent discarding process and transition to the next process, which shortens the time taken.

Although a description of an embodiment of the present disclosure is given above, the present invention is not limited thereto, and may be subjected to various modifications in a range not departing from the gist of the present disclosure. For example, a description is given using electronic component mounting machine 1 which mounts electronic components onto circuit boards as an example of a component mounting machine; however, other component mounting machines may be used. Therefore, the component measurement process and the component mounting process are given as examples of situations in which the remained-on-nozzle phenomenon of the components occurs; however, in a case in which the remained-on-nozzle phenomenon occurs in another process, it is also possible to adopt the present disclosure for that process.

REFERENCE SIGNS LIST

1: electronic component mounting machine, 2: board conveyance device, 3: component supply device, 4: component mounting device, 5: control device, 15: mounting head, 32: suction nozzle, 48: nozzle camera, 56: component measurement instrument, 58: collection box

The invention claimed is:
1. A component handling system comprising:
a head configured to pick up and hold a component by vacuum pumping of a suction nozzle provided on the head; and
a control device configured to control the head to:
pick up the component and set the suction nozzle of the head in a vacuum pumped state to hold the component,
move the suction nozzle to a predetermined position while holding the component,
lower the suction nozzle while holding the component,
cancel the vacuum pumped state of the suction nozzle of the mounting head to attempt a release of the component,
lift the suction nozzle to a first height,
set the suction nozzle of the head to the vacuum pumped state while the suction nozzle is at the first height so that the suction nozzle holds the component if the release of the component failed, and
lift the suction nozzle from the first height while the suction nozzle is in the vacuum pumped state.

* * * * *